United States Patent

Hesler et al.

[15] 3,654,563

[45] Apr. 4, 1972

[54] ACTIVE FILTER CIRCUIT HAVING NONLINEAR PROPERTIES

[72] Inventors: Joseph P. Hesler, Liverpool; Robert J. McFadyen; Fritz H. Schlereth, both of Syracuse, all of N.Y.

[73] Assignee: General Electric Company

[22] Filed: Oct. 15, 1965

[21] Appl. No.: 496,372

[52] U.S. Cl. ..............................328/167, 328/127, 328/164, 328/142, 307/268, 307/295

[51] Int. Cl. ..............................H03f 21/00

[58] Field of Search ..............................328/127, 164, 167, 142; 307/268, 295

[56] References Cited

UNITED STATES PATENTS

| | | | |
|---|---|---|---|
| 3,390,341 | 6/1968 | Kline | 328/127 |
| 3,308,298 | 3/1967 | Rawls et al. | 307/207 X |
| 2,931,901 | 4/1960 | Makrusen | 328/167 X |
| 3,252,105 | 5/1966 | Patchell | 328/127 |

OTHER PUBLICATIONS

RC Kennedy, RCA Review, 12/54, p-p 581 & 585

*Primary Examiner*—John S. Heyman

*Attorney*—Marvin A. Goldenberg, Richard V. Lang, Melvin M. Goldenberg, Frank L. Neuhauser and Oscar B. Waddell

[57] ABSTRACT

An active filter for improving both frequency and noise characteristics of an incoming signal. The filter is a closed loop circuit having a nonlinear network and an integrating network in the feedthrough path and a filter network in the feedback path. In the presence of a rapidly changing input signal the circuit closed loop response peaks over a relatively wide band of higher frequencies for accepting high frequency components of the input signal, while in the presence of noise the closed loop response exhibits a restricted bandwidth.

5 Claims, 11 Drawing Figures

INVENTORS:
JOSEPH P. HESLER,
ROBERT J. McFADYEN,
FRITZ H. SCHLERETH,
BY Marvin D. Goldenberg
THEIR ATTORNEY.

INVENTORS:
JOSEPH P. HESLER,
ROBERT J. McFADYEN,
FRITZ H. SCHLERETH,
BY Marvin D. Goldenberg
THEIR ATTORNEY.

ACTIVE FILTER CIRCUIT HAVING NONLINEAR PROPERTIES

The invention relates, in general, to active filter circuits of the type employing a feedback connection. More particularly, the invention relates to a novel active filter circuit having nonlinear properties for improving both the frequency and noise characteristics of an incoming signal. The filter is nonlinear in the sense that its gain versus frequency response is a function of the amplitude and the rate change of the applied signal. The invention described herein was made in the performance of work under a NASA contract and is subject to the provisions of Section 305 of the National Aeronautics and Space Act of 1958, Public Law 85-568 (72 Stat. 435; 42 U.S.C. 2457).

In virtually all electronic systems, an information bearing signal in its initial processing and transmission is subjected to both frequency and amplitude distortion so that at the point where it is received and its information is to be derived the signal has been changed, to a varying extent, from its original form. The frequency distortions are normally due to a limited bandwidth characteristic of the initial processing circuitry. The amplitude distortions are primarily the result of various sources of noise, for example, thermal noise, atmospheric noise, etc., in the initial processing circuitry and in the transmission channel. There is accordingly an ever present requirement for providing a signal processing circuit which is able to separate the original signal from the background noise and in many instances to improve the frequency content of the signal. The latter requirement is of particular importance in the reception of signals having significant high frequency components, which components are subject to attenuation in the initial circuitry. Pulse transmission, where it is desired to reproduce an originally generated pulse with high fidelity, is of great interest in this regard.

A frequency compensation has been commonly attempted in the prior art utilizing linear filter circuits for peaking up the attenuated high frequency components. Filters used for this purpose have a gain versus frequency response characteristic that is inversely related to the gain versus frequency response of the signal degradation circuitry, so that the overall response is maintained more nearly flat over a wide frequency range. This approach has not been completely satisfactory, however, because in opening up the band to amplify the high frequency components, the band is also opened to additional noise. The end result, therefore, is to improve distortion with respect to the frequency characteristics of the signal but, often, to also impair the signal from the noise standpoint. In particular, where the signal to noise ratio of the incoming signal is not large, or where performance requirements are stringent, the use of linear filters for providing compensation is unsatisfactory. The present invention provides a processing circuit which includes a nonlinear active filter network for reducing frequency distortion with a minimum amount of noise introduced.

It is thus an object of the invention to provide a novel active nonlinear filter circuit which appreciably reduces distortion of a received signal that is due to a degradation in the signal's high frequency content and at the same time improves the signal to noise ratio of the signal.

It is a further object of the invention to provide a novel active nonlinear filter circuit as above described which employs a nonlinear network in a feedback arrangement.

It is a further, more specific object of the invention to provide a novel active nonlinear filter circuit of the above described type which can be employed to process signal pulses so as to restore their original waveform with an accuracy considerably improved as compared to conventional circuits.

These and other objects of the invention are accomplished in a signal processing nonlinear filter circuit which includes a feedback loop having serially connected in the feedthrough path means for providing amplification, a nonlinear network and an integrating network. In the feedback path there is coupled a filter network having a gain versus frequency response characteristic that is inversely related to the gain versus frequency response characteristic of the distortion circuitry to which the incoming signal has been previously subjected. The output of the filter network is coupled to a summing network in phase opposition with the input signal, also coupled to said summing network. The output of the summing network is coupled to the feedthrough path. The nonlinear network exhibits an impedance that is a function of the amplitude of signals applied thereto. Thus, in response to low amplitude signals below a given threshold level, the nonlinear network is in a high impedance state so that the open loop gain of the circuit is low. In response to an applied signal whose amplitude exceeds the threshold level, the nonlinear network is transformed into a low impedance state and the open loop gain of the circuit is high. Further, the parameters of the circuit are adjusted so that for a high open loop gain state the closed loop response is peaked at a band of higher frequencies so as to compensate for the high frequency components of the signal, with the closed loop response being limited for a low open loop gain.

While the specification concludes with claims which set forth the invention with particularity, it is believed that the invention, both as to its organization and method of operation, will be better understood from the following description taken in connection with the accompanying drawings in which:

Figures 1, 2A, 2B, 2C, 3A, 3B:
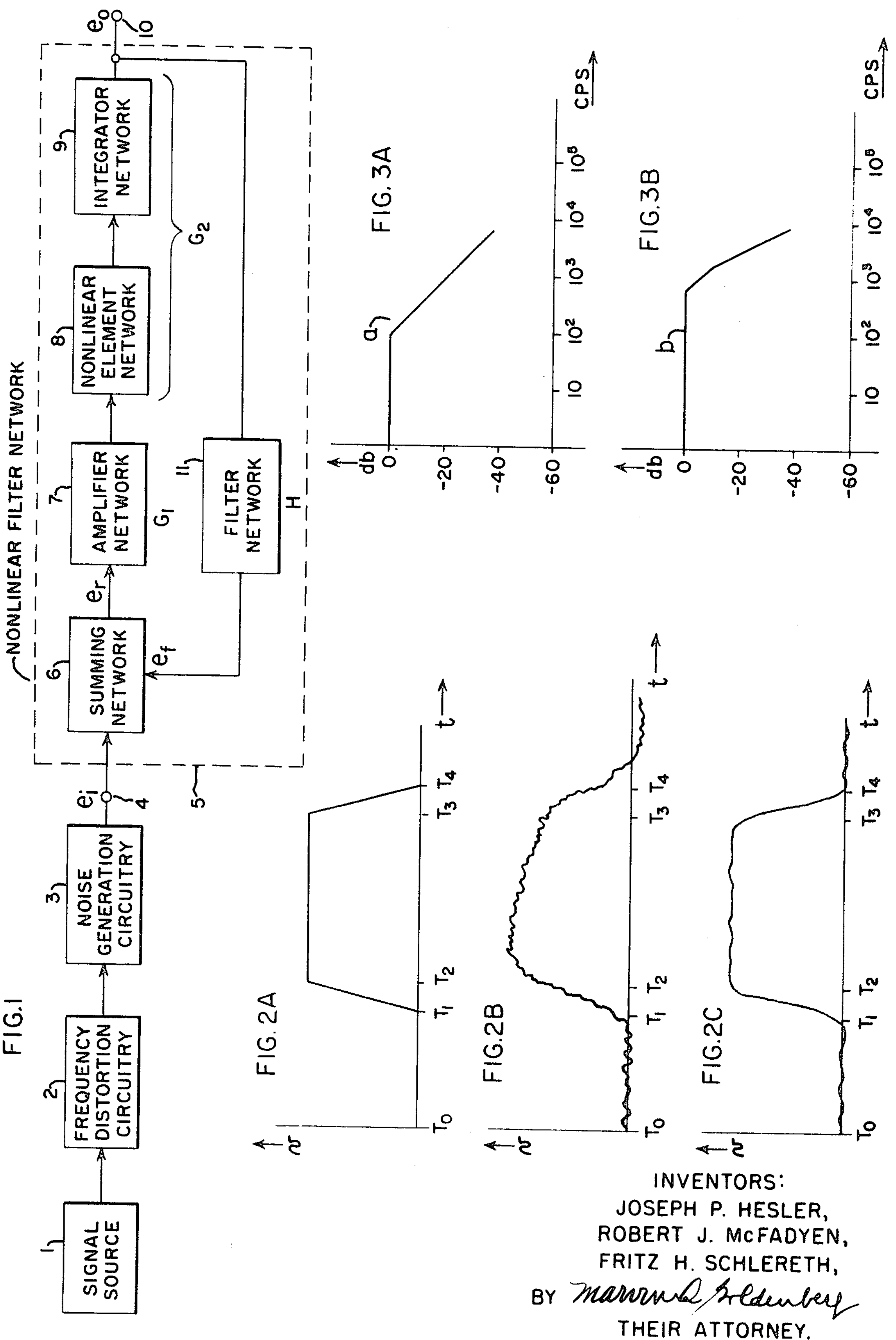
FIG. 1 is a block diagram of an active nonlinear filter circuit in accordance with the invention.
FIGS. 2A, 2B and 2C are graphs of signal pulses appearing at various stages in the circuit of FIG. 1.
FIGS. 3A and 3B are uncompensated and compensated gain versus frequency response curves, respectively, employed in the description of the operation of FIG. 1.
Figure 5A:
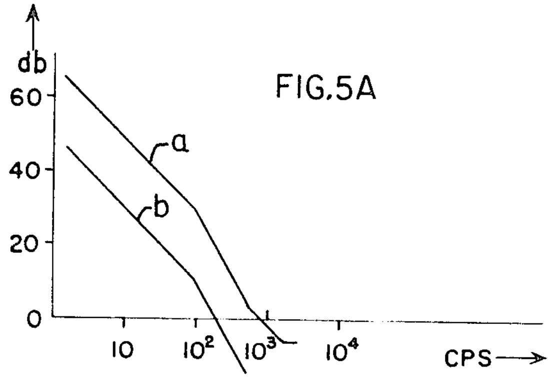
Figure 5B:
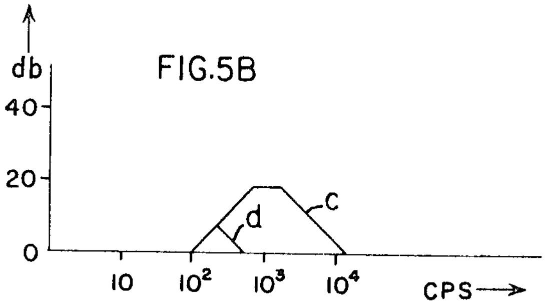
Figure 6:
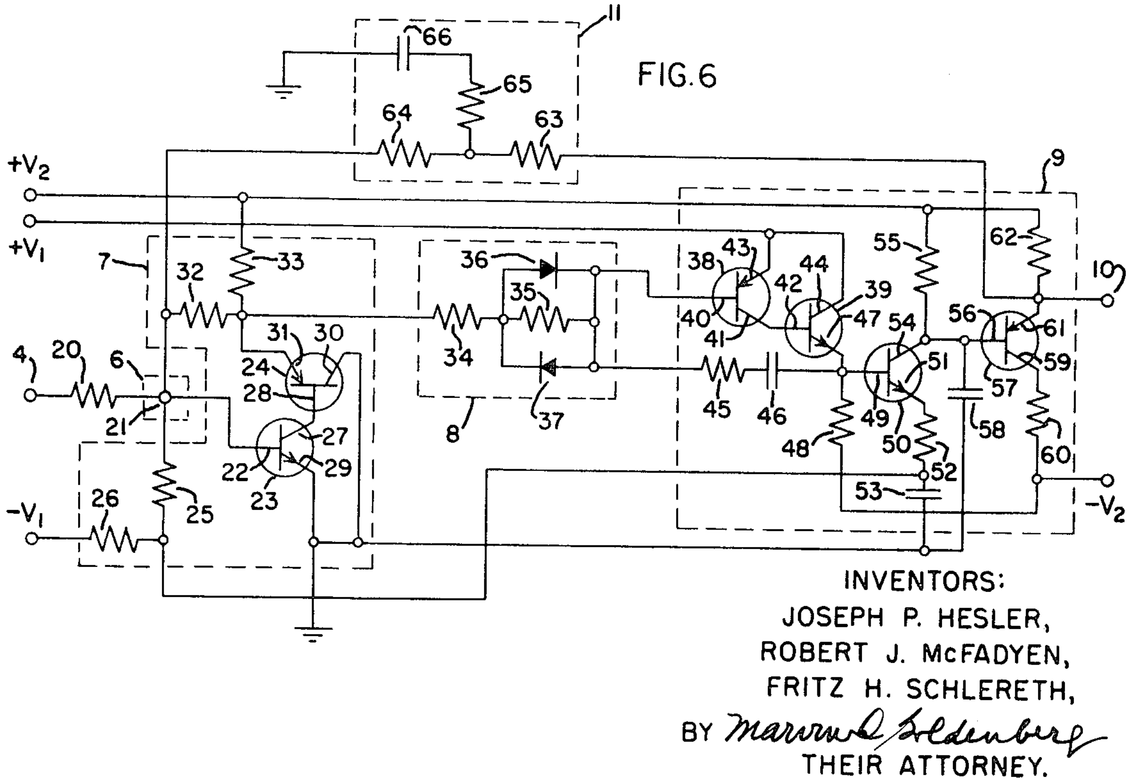

FIGS. 5A and 5B present open and closed loop Bode diagrams, respectively, used in a description of the operation of the circuit of FIG. 1; and FIG. 6 is a schematic circuit diagram of one specific embodiment of the invention shown in FIG. 1.

Referring now to the block diagram of the invention shown in FIG. 1, a signal source 1 has its output coupled through a block 2 labelled frequency distortion circuitry and through a block 3 labelled noise generation circuitry. The signal source 1 is intended to illustrate, in general form, means for generating an information bearing signal of multiple frequency content. The invention has application to many types of signals extending from the audio band to the rf band and which can be of a pulse or sinusoidal waveform. For purposes of explanation a pulse signal will be referred to, as illustrated in FIG. 2A, which is in the audio band. The frequency distortion circuitry 2 represents all of the sundry bandwidth limited signal processing circuits to which a signal may be subjected prior to its being received and detected. Thus, the block 2 is intended to include various filter, amplifying and mixing networks, and the like, having a limited high frequency response. The combined gain vs. frequency response curve for the various circuits of block 2 is schematically illustrated by the curve in FIG. 3A. Block 3 is intended to represent all sources of noise generation prior to reception, including noise from the various active circuits traversed by the signal as well as noise from the transmission media. Thus, the signal $e_i$ which appears at terminal 4 has been frequency distorted and subjected to noise, as illustrated in FIG. 2B.

In accordance with the invention there is provided an active nonlinear filter circuit 5 for substantially transforming the applied signal $e_i$ to its original form. The nonlinear filter circuit 5 is a feedback circuit which functions to boost the high signal frequency components that have been previously attenuated, thereby extending the flat portion of the overall gain versus frequency response, such as shown by the curve in FIG. 3B. At the same time, the higher frequency noise components are introduced to only a limited extent.

Figure 4A:
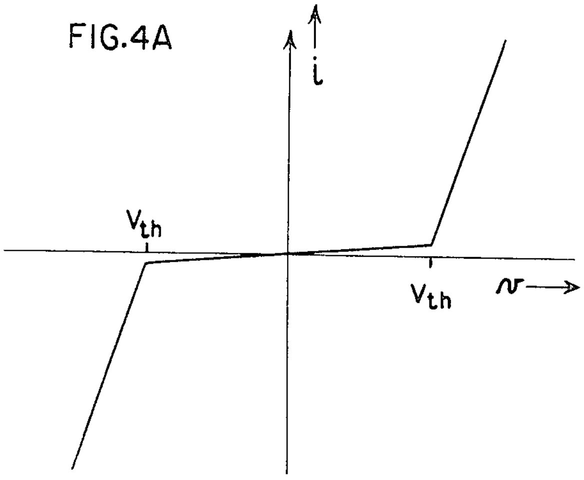
FIG. 4A is a curve illustrating the voltage versus current characteristic of one form of linear network.

The feedback circuit includes in its feedthrough path the serial connection of a summing network 6, a high gain amplifier network 7 having a transfer characteristic $G_1$, a nonlinear element network 8 and an integrating network 9 having a combined transfer characteristic $G_2$. The output signal of the circuit $e_o$, schematically illustrated in FIG. 2C, is obtained from network 9 at the output terminal 10. The output is also fed back to the summing network 6 through a filter network 11 having a transfer characteristic H, appearing at network 6 as $e_f$. The signal $e_f$, in conventional fashion, is fed back with opposite phase to the signal $e_i$ so as to be effectively subtracted from $e_i$ in network 6. The nonlinear element network 8 exhibits an impedance that is a function of the voltage applied thereto. In a typical nonlinear network, such as the diode network shown in FIG. 6, the impedance is extremely high for applied voltages of small amplitude, abruptly changing to a very low value beyond a given threshold level of voltage. An idealized voltage versus current curve for network 8 is shown in FIG. 4A. The filter network 11 has a gain versus frequency response characteristic which, within the constraint of maintaining loop stability, is approximately matched to the response characteristics of the signal distortion circuitry 2, shown in FIG. 3A.

Considering the operation of the circuit of FIG. 1, the applied signal $e_i$ has a limited high frequency content so that the leading and lagging edges of the pulse signal are no longer precisely defined, as shown in FIG. 2B. In addition, the signal has noise associated with it. It is desired that the output signal $e_o$ generated from the filter circuit 5 have an improved high frequency content and an improved noise figure so as to more closely resemble the original pulse waveform shown in FIG. 2A.

From the open and closed loop Bode diagrams of FIGS. 5A and 5B it may be shown in a qualitative manner how the described nonlinear filter circuit 5 provides the noted improvement. It may be appreciated that the open loop gain of the circuit is given by $G_1G_2H$. For a low impedance state of the nonlinear network 8 the open loop gain is high, the high gain open loop gain versus frequency response curve being shown by curve "a" in FIG. 5A. The curve is seen to have a uniform slope of minus 20 db per decade to a frequency of about 100 cycles per second at which point it breaks to a minus 40 db per decade slope. A further break to the minus 20 db per decade slope occurs at about 500 cycles per second. The zero db line is crossed at a point slightly beyond the second break point, and a third break point occurs at about 1,500 cycles per decade. For a high impedance state of the nonlinear element network 8, the open loop gain is relatively low and the response curve for this state is shown by curve "b" in FIG. 5A. This curve follows curve "a" but at a lower amplitude, crossing the zero db line at below 200 cycles per second. The above specific values are derived from the parameters employed in the circuit of FIG. 6.

The closed loop transfer characteristic of the circuit is given as:

$$\frac{e_0}{e_1}=\frac{G_1G_2}{1+G_1G_2H} \qquad (1)$$

which can be expressed as $$\frac{e_0}{e_1}=\frac{1/H}{1+\frac{1}{G_1G_2H}} \qquad (2)$$

A normalized closed loop gain versus frequency response curve for high gain is illustrated by curve "c" in FIG. 5B, and a normalized closed loop response curve for low gain is illustrated by curve "d" in FIG. 5B. The closed loop response curve "c" is seen to be uniform at zero db up to about 100 cycles per second. At this point, corresponding to the first break point on the high gain open loop curve "a," the gain increases to a db level at which the frequency corresponds to the zero crossover of curve "a." The closed loop response then flattens out. The circuit parameters are adjusted so that the slope of the rise portion of the closed loop curve, which is shown as about 20 db per decade, is inversely related to the slope of the roll off portion of the gain versus frequency response for the frequency distortion circuitry of block 2, shown in FIG. 3A. At a frequency corresponding to the third break point of curve "a," curve "c" falls off and crosses the zero db line at a frequency of beyond 10,000 cycles per second.

The low gain closed loop low gain curve "d" is seen to follow the high gain closed loop curve "c" to a frequency corresponding to the zero crossover point of the low gain open loop curve "b." At this frequency the curve "d" falls off and crosses the zero db line at a frequency under 1,000 cycles per second.

From the closed loop curves "c" and "d" it may be seen that when a signal is present and the open loop gain is high, a relatively wide band of higher frequencies are provided with gain, the net effect being to open up the overall bandwidth to an appreciable extent and to compensate for the attenuation of high frequency components by the frequency distortion circuitry. During that portion of the operation when a signal is not present, and only noise in evidence, the increased band of frequencies is very small and only a relatively small amount of additional noise is introduced. It thus has been demonstrated that the condition of gain of the circuit, i.e., whether the gain is high or low, is a function of signal amplitude. During the course of subsequent discussion it will be shown that the gain condition is also a function of the rate of change of the input signal so that for rapid signal changes the gain tends to be high and for slow signal changes, to be low.

Figure 4B:
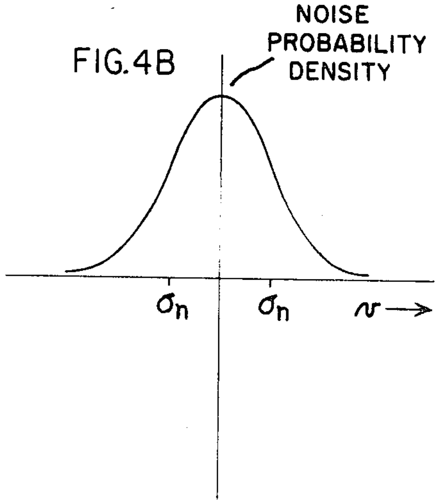
FIG. 4B is a graph of the gaussian noise distribution to which the incoming signal to the nonlinear filter may be subject.

During that portion of the signal $e_i$ between $T_0$ and $T_1$ when the signal amplitude is zero and there is only noise present as shown in FIG. 2B, the nonlinear element network 8 is mainly of high impedance, it being assumed that the noise level is below the threshold level of the nonlinear network. A gaussian distribution of the noise is shown by the noise curve in FIG. 4B, wherein noise probability density versus voltage is plotted. The circuit is adjusted so that the rms value of the noise $\sigma n$ is about one third the threshold level $V_{th}$ of network 8 so that the noise will exceed the threshold level only a small percentage of the time. For a zero signal amplitude condition, the open loop transfer characteristic of the filter circuit 5 is in general low as in curve "b" of FIG. 5A. Due to the parameters of the circuit, the high frequency components of the feedback signal $e_f$ to the summing network 6 are amplified to a relatively small extent and do not appreciably subtract from like components in the input signal $e_i$. These components in the error signal $e_r$ are therefore of the same order as the input signal. As an approximation, the circuit operates as though only the feedthrough path is present. For that minor portion of the high frequency components of the incoming noise energy which is of high energy and as applied to network 8 will exceed the threshold level, the high gain region of operation is established. A small amount of noise is accordingly passed by the circuit.

The low frequency components of the feedback signal are amplified to some appreciable extent and are effective to provide subtraction from the input signal so as to establish comparable components in the error signal that are of small amplitude relative to the input signal. These low frequency components of the error signal are well below the threshold level of network 8 and dictate a low gain operation. It is thus seen how in the absence of a signal the noise is passed at a relatively low energy content and with a limited bandwidth.

At time $T_1$ the signal amplitude begins to rapidly rise and upon the threshold of the nonlinear element network 8 being exceeded, the network changes to its low impedance state, in which state the open loop gain is sufficiently high so that the feedback operation of the circuit is effective. During the rise time of the input pulse signal $e_i$, between times $T_1$ and $T_2$, the input signal is rapidly changing so that the fluctuating error signal, although generally of an amplitude small relative to the input signal, attains absolute values sufficiently large to place the network 8 predominantly in its low impedance state and the overall circuit in a high gain condition. For a high gain operation, the feedback signal $e_f$ may be considered to be approximately equal to the input signal $e_i$. By assigning to the feedback filter network 11 a gain versus frequency response characteristic that is approximately equal to that of the frequency distortion circuitry of block 2, the leading edge of the output signal $e_o$ can be made to approximate that of the original signal. It is understood that the gain and the phase shift constraints of the circuit must also be properly established so as to provide a stable operation, and the compensating parameters assigned to the filter network 11 are assigned not without regard to this consideration.

During the flat portion of the pulse, between times $T_2$ and $T_3$, the input signal is but slowly changing so that the error signal is extremely small and below the threshold level of network 8. The network 8 is predominantly in its high impedance state and only a limited noise is passed, as previously discussed. During the lagging edge of the pulse, between times $T_3$ and $T_4$, the signal is again rapidly varying and the error signal is such as to place network 8 predominantly in its low impedance state, as discussed with respect to the leading edge operation.

It is noted that during portions of the operation when the leading and lagging edges of the signal are present, some variation in the rate of change of the signal provides a degree of noise suppression by the circuit, although not of the same order as when the signal is essentially unchanging. The described operation therefore permits a more precise indication of the initiation of the pulse's leading edge and the termination of the pulse's lagging edge.

Referring now to the detailed schematic diagram of FIG. 6, the incoming signal from terminal 4 is connected through a bias resistor 20 to a junction 21 coupled to the base electrode 22 of an NPN transistor 23 of amplifier network 7. The junction 21 corresponds to the summing network 6 of FIG. 1. The amplifier network 7 includes a further PNP transistor 24 coupled in cascade with transistor 23 as an operational amplifier. The base electrode 22 is connected through the serial connection of bias resistors 25 and 26 to a source of negative potential $-V_1$. The collector electrode 27 of transistor 23 is connected to the base electrode 28 of transistor 24, the emitter 29 of transistor 23 and the collector 30 of transistor 24 being connected to ground. The emitter 31 of transistor 24 is connected by a feedback resistor 32 to the junction 21 and through a bias resistor 33 to a positive potential source $+V_2$. The output of network 7 is connected from the emitter 31 to nonlinear diode network 8. Network 8 includes series connected current limiting resistors 34 and 35. The resistance of resistor 35 is substantially higher than that of resistor 34. Connected in parallel with resistor 35 is a first diode element 36 poled in a first direction and a second diode element 37 poled in the opposite direction. The junction of diodes 36 and 37 and resistor 35 is connected to the integrating network 9. The voltage versus current characteristic for the diode network 8 is shown in FIG. 4A. With the diodes 36 and 37 in their high impedance state, exhibiting an impedance substantially greater than that of resistor 35, the impedance of network 8 is determined primarily by the resistor 35. This is illustrated by the portion of the curve below $V_{th}$. When the the diodes are in their low impedance state, the resistance of resistor 34 primarily determines the network's impedance, shown by the portion of the curve above $V_{th}$.

The integrating network 9 includes a first pair of complementary transistors 38 and 39, which also function as an operational amplifier. The output of network 8 is connected connected to the base electrode 40 of PNP transistor 38. The collector electrode 41 of transistor 38 is connected to the base electrode 42 of NPN transistor 39, the emitter 43 of transistor 38 and the collector 44 of transistor 39 being connected to a voltage source $+V_1$. The series feedback connection of a resistor 45 and an integrating capacitor 46 is connected from the emitter 47 of transistor 39 to the base 40 of transistor 38 so as to provide the integrating function. The junction of capacitor 46 and the emitter 47 is connected through a bias resistor 48 to a source of negative potential $-V_2$ and to the base electrode 49 of an NPN transistor 50. The emitter 51 of transistor 50 is connected through a bias resistor 52 and a serially connected by-pass capacitor 53 to ground, the junction of resistor 52 and capacitor 53 being connected to the junction of resistors 25 and 26. The collector 54 of transistor 50 is connected through a bias resistor 55 to source $+V_2$ and to the base electrode 56 of emitter follower connected PNP transistor 57. Base 56 is connected through by-pass capacitor 58 to ground. The collector 59 of transistor 57 is connected through a bias resistor 60 to source $-V_2$ and the emitter 61 thereof is connected through a bias resistor 62 to source $+V_2$. From the emitter 61 is taken the output of the circuit coupled to terminal 10. In addition, a feedback connection is made from this point through the filter network 11 which includes the series connection of a first resistor 63 connected to emitter 61 and a second resistor 64 connected to the junction 21. From the juncture of resistors 63 and 64 is connected a further resistor 65 and a capacitor 66 in series to ground.

The initial slope of the open loop curves "*a*" and "*b*" of FIG. 5A is due principally to the value of capacitor 46. The values of the resistors 63 and 64 in parallel with capacitor 66 determine the first break point frequency of the open loop curves "*a*" and "*b*." The values of resistor 45 and capacitor 46 primarily determine the second break point of said curves, and the values of resistor 55 and capacitor 58 primarily determine the third break point. These are the principal parameters, therefore, for providing proper adjustment of the circuit so as to perform the desired frequency compensation and maintain the requisite loop stability.

The following circuit components and parameters were employed in one exemplary operation of the circuit of FIG. 6. They are given for purposes of illustration and are not to be construed as limiting:

| | |
|---|---|
| Transistors 23 and 39 | Type 2N930 |
| Transistors 24, 38 and | Type 2N 2604 |
| Transistor 50 | Type 2N1613 |
| Diodes 36 and 37 | 1N914 |
| Capacitor 53 | 47 μf |
| Capacitor 58 | .01 μf |
| Capacitor 46 | .33 μf |
| Capacitor 66 | .07 μf |
| Resistor 20 | 20.5 K |
| Resistors 25 and 35 | 100 K |
| Resistors 26, 45, 52 and 65 | 1 K |
| Resistor 32 | 1 M |
| Resistors 33, 34, 48, 60, 55 and 62 | 10 K |
| Resistors 63 and 64 | 51.1 K |
| Voltage source $+V_1$ | 10 V |
| Voltage source $+V_2$ | 20 V |
| Voltage source $-V_1$ | −10 V |
| Voltage source $-V_2$ | −20 V |

The operation of the circuit illustrated in FIG. 6 conforms to that previously described with respect to FIG. 1. Accordingly, in response to the presence of noise, as during the period between times $T_0$ and $T_1$ in FIG. 2B the amplified error signal appearing at the output of amplifier network 7 is predominantly insufficient to cause the threshold voltage level of diodes 36 and 37 to be exceeded and they are primarily in their high impedance state. The effective impedance of the diode network is then determined by the series combination of resistors 34 and 35. For this state, the capacitor 46 undergoes negligible charge variations and the output voltage is essentially fixed at the zero level. As previously explained, a very small percentage of the noise energy will be sufficient to cause the threshold level of network 8 to be exceeded. The diodes are then in a low impedance state and the network impedance is essentially that of resistor 34. For this state a low impedance current path is available for varying the charge of the capacitor 46, and the output voltage will correspondingly vary slightly about the zero level.

Consider now the leading edge of the signal pulse, which in its originally generated form may be considered to be perfectly linear, as shown in FIG. 2A. For purposes of explanation, the output pulse will be assumed to have a corresponding ramp function for its leading edge, which is an idealized case. In order for the output to rise linearly, the capacitor 46 must be charged at a constant rate and the error voltage must therefore have a constant value, the capacitor being charged through the diode network 8. It has been seen that the output signal is fed back through the filter network 11 for providing the feedback signal, which is supplied to the junction 21 together with the input signal. In order for the error voltage to be a constant, it is necessary that the feedback signal closely correspond to the input signal. By providing the filter network 11 with a frequency response characteristic comparable to that of the distortion circuitry, the requisite correspondence between the feedback signal and the input signal is achieved.

In the more practical sense, the leading edge of the output signal will not be perfectly linear, but will have considerable fluctuations due to noise, slight inaccuracies in circuit adjustment, etc. Accordingly, the error voltage, which has been seen to be the derivative of the output voltage, is not a constant but varies considerably. During the course of error signal variations, the diode network impedance will intermittently change between its low impedance and its high impedance state. During the high impedance state, or low gain operation, noise transmission to the output is restricted.

During the flat peak portion of the applied signal, the rate of change of signal amplitude is predominantly slow. As has been seen, for this condition a low gain operation is in effect and the output voltage is relatively constant with the noise level restricted. During the lagging edge of the applied pulse, the operation is similar to that of the leading edge except that the capacitor now discharges through the diode network during rapid signal amplitude changes.

Although the invention has been described with respect to a specific embodiment thereof for the purpose of complete and clear disclosure, it is recognized that numerous modifications and changes may be made which would not depart from the basic teachings set forth. For example, other conventional nonlinear networks, having an impedance that is a nonlinear function of an applied signal, can be employed for the disclosed nonlinear diode network 8, such as of a transistor configuration. Further, although a pulse signal has been specifically referred to, it should be appreciated that the disclosed circuit has application to numerous multiple frequency signals of different type, as has been stated previously.

The appended claims are intended to include all such variations and modifications that fall within the metes and bounds of the invention.

We claim:

1. A nonlinear active filter circuit providing signal to noise improvement for pulsed input signals, comprising:

a. a closed loop circuit including a feedthrough path and a feedback path adjusted so as to provide loop stability, b. said feedthrough path including a nonlinear resistance network, the resistance of which is high for low input levels to produce a low gain feedthrough and the resistance of which is low for high input levels producing a high gain feedthrough, c. said feedthrough path further including integrating means having separate input and output terminals, said input terminal being coupled to said nonlinear network, and said output terminal, which provides the output signal of the circuit, replicating the input signal through integration, the difference between said integrated output signal and said input signal representing a time derivative of the output signal, said derivative having a level during rapidly changing portions of said signal adequate to transfer said nonlinear network into a higher gain mode, d. a comparator means, e. means for applying said input signal and the integrated output signal to said comparator means for obtaining therefrom an error signal that represents said derivative, and f. Means for applying said error signal to said nonlinear network so as to transfer it to a high gain mode during said rapidly changing signal portions.

2. A nonlinear active filter circuit as in claim 1 wherein said input signal has suffered frequency distortion from its original form by an initial processing circuitry prior to being applied to said active filter circuit and wherein said feedback path includes a filter network constructed to have a frequency response characteristic that is approximately matched to the frequency response characteristic of said initial processing circuitry, wherein said output signal is constrained to closely correspond to said input signal in its original form.

3. A nonlinear active filter circuit as in claim 2 wherein said closed loop circuit includes means for providing gain around the loop adjusted so that the closed loop gain is uniform at relatively low frequencies, peaks over a wide band of higher frequencies with a rising slope that provides compensation for high frequency components of said input signal when said nonlinear network is in a low impedance state, and peaks for a limited band of higher frequencies when said nonlinear network is in a high impedance state so as to restrict the passage of noise.

4. A nonlinear active filter circuit as in claim 3 wherein said nonlinear network includes means for providing a first high impedance state in response to applied signals below a given threshold level and a second low impedance state in response to signals above said threshold level, in the presence of noise alone and in the presence of a slowly varying input signal as applied to said active filter circuit said error signal being of relatively small amplitude so that said nonlinear element is predominantly in its high impedance state, and in the presence of a rapidly varying signal above the noise level as applied to said active filter circuit said error signal is of a relatively large amplitude so that said nonlinear element is predominantly in its low impedance state.

5. A nonlinear filter circuit as in claim 4 wherein said nonlinear network includes a first resistor connected in series with the shunt combination of a second resistor and a pair of oppositely poled semiconductor diodes, the value of said first resistor being very much smaller than said second resistor and very much greater than the low impedance value of said diodes, and the value of said second resistor being very much smaller than the high impedance value of said diodes.

* * * * *